(12) United States Patent
Obara

(10) Patent No.: US 8,004,589 B2
(45) Date of Patent: Aug. 23, 2011

(54) SOLID STATE IMAGING DEVICE

(75) Inventor: Yoshihiro Obara, Kitakami (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 768 days.

(21) Appl. No.: 12/122,125

(22) Filed: May 16, 2008

(65) Prior Publication Data

US 2008/0284893 A1    Nov. 20, 2008

(30) Foreign Application Priority Data

May 17, 2007    (JP) .................................. 2007-131725

(51) Int. Cl.
*H04N 5/335* (2006.01)
(52) U.S. Cl. ........................................ 348/294; 348/308
(58) Field of Classification Search .................. 348/294, 348/302–308, 311, 319; 257/291–293; 250/208.1
See application file for complete search history.

(56) References Cited

U.S. PATENT DOCUMENTS

| | | | |
|---|---|---|---|
| 6,822,682 B1 | 11/2004 | Kawajiri et al. | |
| 7,027,093 B2 | 4/2006 | Miyahara | |
| 7,176,972 B2 | 2/2007 | Mutoh et al. | |

FOREIGN PATENT DOCUMENTS

| | | |
|---|---|---|
| JP | 2-290074 | 11/1990 |
| JP | 4-367237 | 12/1992 |
| JP | 2000-286409 | 10/2000 |
| JP | 2004-312664 | 11/2004 |

*Primary Examiner* — Darryl J Collins
(74) *Attorney, Agent, or Firm* — Oblon, Spivak, McClelland, Maier & Neustadt, L.L.P.

(57) ABSTRACT

A signal charge transfer channel region includes a first polysilicon gate electrode as a storage electrode for storing signal charges and a second polysilicon gate electrode as a barrier electrode for transferring the signal charges stored under the first polysilicon gate electrode to under the first polysilicon gate electrode adjacent to the first polysilicon gate electrode. The both end portions of the plurality of first and second polysilicon gate electrodes are alternately arranged perpendicularly to a transfer direction of signal charges and central portions thereof are alternately arranged obliquely to a transfer direction of signal charges.

14 Claims, 4 Drawing Sheets

SOLID STATE IMAGING DEVICE

CROSS-REFERENCE TO RELATED APPLICATIONS

This application is based upon and claims the benefit of priority from the prior Japanese Patent Application No. 2007-131725, filed on May 17, 2007; the entire contents of which are incorporated herein by reference.

BACKGROUND OF THE INVENTION

The present invention relates to a solid state imaging device and, in particular, to a signal charge transfer unit for transferring signal charges produced by a photoelectric conversion unit.

An imaging device having photoelectric conversion elements outputs light received from a photographing object as signal charges of the amount corresponding to the light amount using the photoelectric conversion elements and transfers the output signal charges to an image output circuit thereby outputs image signals.

A conventional solid state imaging device includes: a plurality of photoelectric conversion elements arranged on a semiconductor substrate in a one-dimensional or two-dimensional array and isolated by an isolation region; a plurality of read gate electrodes for reading signal charges obtained from the photoelectric conversion elements; a plurality of transfer gate electrodes for transferring the signal charges read by the read gate to a channel region; and a channel region for transferring the signal charges drawn into a channel region to another channel and an image output circuit.

The channel region includes a plurality of storage electrodes for storing the signal charges transferred through a transfer gate in a channel region and a plurality of barrier electrodes for transferring the signal charges stored in a semiconductor layer under the storage electrodes to a semiconductor layer under the storage electrodes adjacent thereto. The storage electrodes and barrier electrodes are alternately arranged perpendicularly to a transfer direction of signal charges. In addition, one of both end portions of the semiconductor layer under the storage electrode is connected to the transfer gate and the other is connected to a channel stop region. Signal charges are transferred by applying voltage pulses to the storage electrodes and the barrier electrodes so that the voltages under the electrodes are set to be higher than that in the vicinity thereof.

On the other hand, there has been known a solid state imaging device which transfers signal charges at high speed by forming storage electrodes and barrier electrodes obliquely to a transfer direction of signal charges so as to shorten a transfer distance of signal charges between the adjacent storage electrodes.

Further, Japanese Patent Application Laid-Open No. 2004-312664 has disclosed a solid state imaging device which includes channel regions of the same number as output channels and in which transfer electrodes for transferring signal charges between the channel regions are formed obliquely to a transfer direction toward an output direction of signal charges.

However, in such a channel region having a structure in which storage electrodes and barrier electrodes are arranged obliquely to a transfer direction of signal charges, a trajectory on which signal charges are transferred passes by a channel stop region or collides with the channel stop region. The reason is that signal charges are transferred perpendicularly to the obliquely arranged storage electrodes and barrier electrodes. Transfer with low-voltage pulses under such condition causes severe loss, and thus high-speed and highly efficient transfer of signal charges has been difficult.

BRIEF SUMMARY OF THE INVENTION

It is an object of the present invention to provide a solid state imaging device that enables high-speed and highly efficient transfer with less loss with a low-voltage pulse.

A solid state imaging device according to an aspect of the present invention includes: a plurality of photoelectric conversion elements arranged on a semiconductor substrate in a one-dimensional or two-dimensional array; a plurality of read gate electrodes for reading the signal charges obtained from the photoelectric conversion elements; a plurality of transfer gate electrodes for transferring the signal charges read by the read gates thereof to a channel region; a plurality of storage electrodes for storing the signal charges transferred through transfer gates; and a plurality of barrier electrodes for transferring the signal charges stored under the storage electrodes to a region under the adjacent storage electrodes, wherein both end portions of the plurality of storage electrodes and the plurality of barrier electrodes are alternately arranged perpendicularly to a transfer direction of signal charges; the central portions of the plurality of storage electrodes and the plurality of barrier electrodes are alternately arranged obliquely to the transfer direction of signal charges; semiconductor layers under the plurality of barrier electrodes have different depths sequentially in parallel direction to a transfer direction of signal charges, the semiconductor layers at both end portions under the plurality of barrier electrodes are arranged perpendicularly to a transfer direction of signal charges and the central portions of the semiconductor layers under the plurality of barrier electrodes are arranged obliquely to a transfer direction of signal charges.

DETAILED DESCRIPTION OF THE INVENTION

Figure 1:
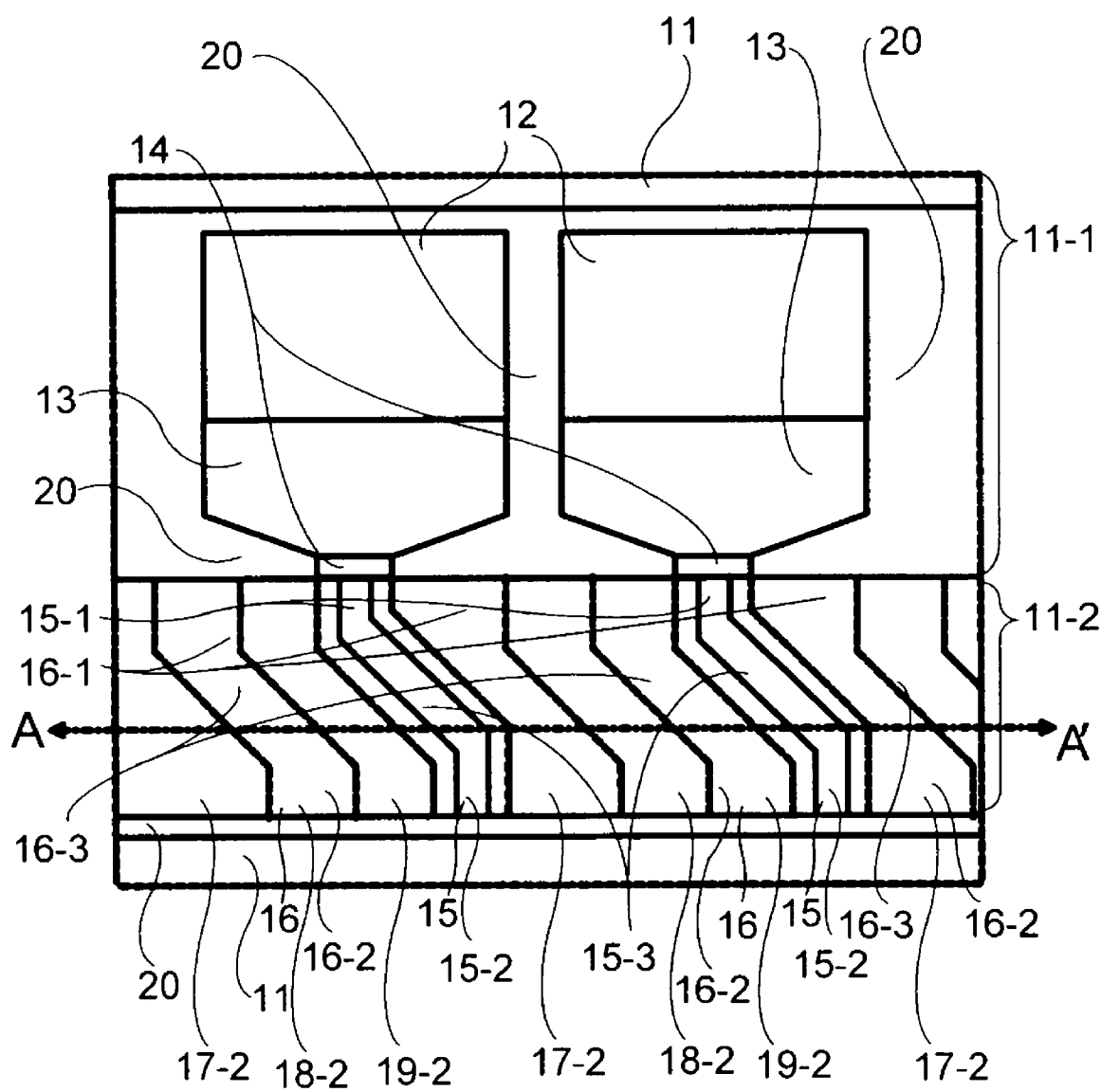
FIG. 1 is a top view illustrating an embodiment of a solid state imaging device according to the present invention.
Figure 2:
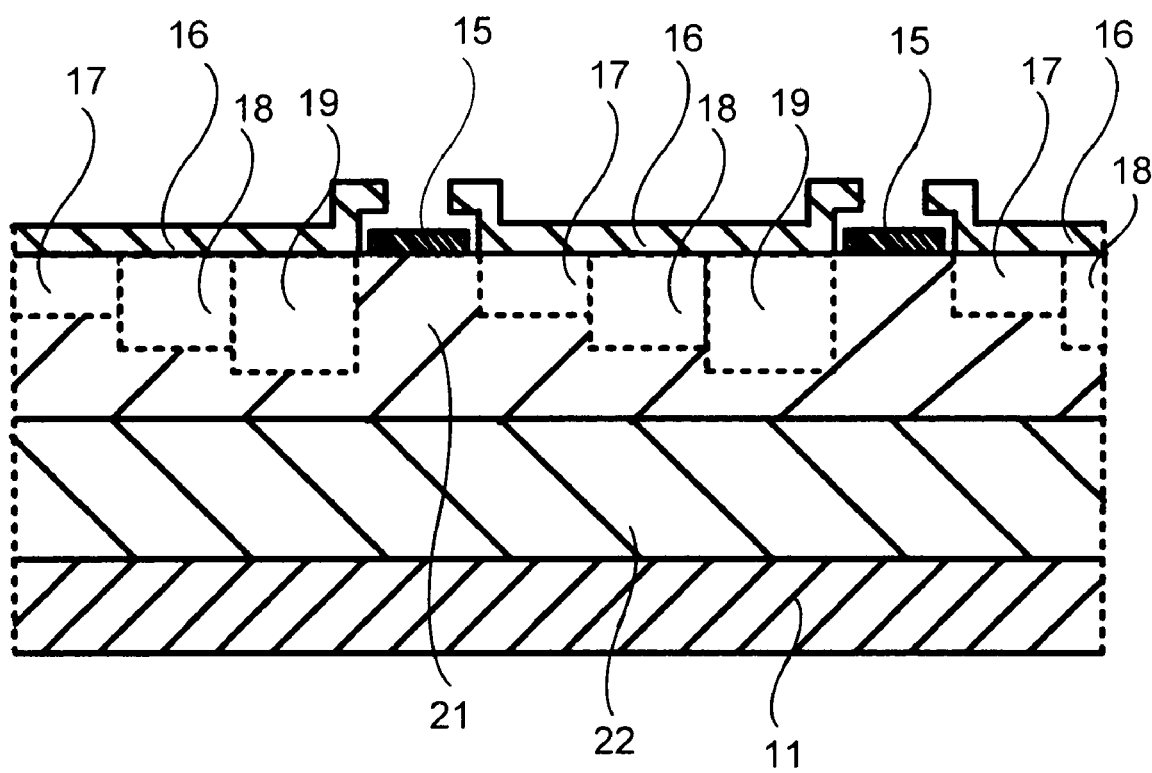
FIG. 2 is a sectional view taken along broken line A-A' of FIG. 1.

Referring to FIGS. 1 to 4, an embodiment of the present invention will be described below. FIG. 1 is a top view illustrating a structure of a substantial part of a solid state imaging device according to one embodiment of the present invention. FIG. 2 is a sectional view taken along line A-A' of the solid state imaging device in FIG. 1.

A P-type semiconductor layer 22 is formed on an N-type semiconductor substrate 11. In the P-type semiconductor layer 22, there are embedded a plurality of photoelectric conversion elements 12, each of which includes an N-type semiconductor layer and P+ type semiconductor layer covering the surface of the N-type semiconductor layer. The photoelectric conversion elements 12 are substantially rectangular in a plane pattern thereof and arranged on the N-type semiconductor substrate 11 in a one-dimensional or two-dimensional array. A region on the N-type semiconductor substrate 11 where the photoelectric conversion elements 12 are formed forms a photoelectric conversion portion 11-1.

On the photoelectric conversion portion 11-1, read gate electrodes 13 for reading a signal charge connected to the respective photoelectric conversion elements 12 are also provided. In the read gate electrode 13, one side thereof adjacent to the photoelectric conversion element 12 has a width substantially the same as a width of the photoelectric conversion element 12 and on the opposite side thereto, has a width smaller than the width of the photoelectric conversion element 12. Specifically, the read gate electrode 13 has a trapezoidal shape as a whole. The read gate electrode 13 reads signal charges produced by the photoelectric conversion element 12 and stores the signal charges in a semiconductor layer under the read gate electrode 13. The transfer gate electrodes 14 are disposed, adjacent to the respective read gate electrodes 13. The respective transfer gate electrodes 14 are substantially rectangular in plane pattern thereof and a width thereof is substantially the same as that of the shorter side of the gate electrode 13. The transfer gate electrode 14 is provided to transfer signal charges stored in a semiconductor layer under the read gate electrode 13 to a channel region 11-2.

The channel region 11-2 is a region adjacent to the photoelectric conversion portion 11-1 on the N-type semiconductor substrate 11 and a band-like region provided in parallel to the lines of the plurality of photoelectric conversion elements 12. The channel region 11-2 has the N-type semiconductor layer 21 embedded into the P-type semiconductor layer 22 of the N-type semiconductor layer 11.

To each of the respective transfer gates 14, a first polysilicon gate electrode 15 is connected. The first polysilicon gate electrode 15 is a band-like storage electrode arranged to traverse the channel region 11-2. so as to store the signal charges transferred through each of the transfer gates 14 in the channel region 11-2. Between the adjacent first polysilicon gate electrodes 15, there is disposed a second polysilicon gate 16. The second polysilicon gate 16 is a band-like barrier electrode arranged to traverse the channel region 11-2. so as to transfer the signal charges stored under the first polysilicon gate electrode 15 to a region under the adjacent first polysilicon gate electrode 15. The second polysilicon gate electrode 16 is partially overlapped with the adjacent first polysilicon gate electrode 15 in a horizontal direction thereof.

The plurality of first polysilicon gate electrodes 15 and second polysilicon gate electrodes 16 generally have a bent plane pattern so that both end portions 15-1, 15-2, 16-1, 16-2 thereof in a longitudinal direction are substantially perpendicular to a transfer direction of signal charges and central portions 15-3, 16-3 are arranged obliquely to a transfer direction of signal charges. A transfer direction of signal charges used herein refers to a direction substantially coinciding with a longitudinal direction of the band-like channel region 11-2 direction toward either side, for example, a direction from the right to the left in FIG. 2.

The semiconductor layer under the plurality of second polysilicon gate electrodes 16 includes a first diffusion layer 17, a second diffusion layer 18 and a third diffusion layer 19 sequentially arranged in a transfer direction of signal charges. The first, the second and the third diffusion layers 17, 18, 19 are respectively made of P+ diffusion layers different in depth from each other. The depths of the P+ diffusion layers are smaller toward a transfer direction of electric charges. The first, the second and the third diffusion layers 17, 18, 19 are different in diffusion concentration from each other and are thinner in impurity concentration toward a transfer direction of electric charges. In addition, the end portions on the opposite side to the photoelectric conversion portion 11-1 in a horizontal direction of the band-like channel region 11-2 is defined by a channel stop region 20. The portion in the photoelectric conversion portion 11-1 except the photoelectric conversion element 12, the gate electrode 13 and the transfer gate electrode 14 is also defined by the channel stop region 20.

The first, the second and the third diffusion layers 17, 18, 19 are band-like regions arranged to traverse the channel region 11-2, similar to the first polysilicon gate electrode 15 or the second polysilicon gate electrode 16, and each of the plane patterns thereof is adapted in such a manner that both end portions are disposed perpendicularly to a transfer direction of signal charges and central portions thereof are disposed obliquely to a transfer direction of signal charges.

Next, operation of the solid state imaging device structured as described above will be described below.

By applying a pulse voltage to the read gate electrode 13, the signal charges obtained from the photoelectric conversion element 12 are stored in a semiconductor layer under the read gate electrode 13.

The signal charges stored under the read gate electrode 13 pass through the semiconductor layer under the transfer gate electrode 14 and are transferred to a semiconductor layer under the first polysilicon gate electrode 15 by applying a pulse voltage to the transfer gate electrode 14. Specifically, by applying a pulse voltage to the transfer gate electrode 14, a potential difference is generated between the semiconductor layers under the transfer gate and the first poly silicon gate electrode 15, and hence signals charges move as described above.

When a pulse voltage is applied to the first and the second polysilicon gate electrodes 15 and 16, an N-type semiconductor layer 21 has the highest potential and potentials of the P+ type diffusion layers 17, 18, 19 under the second polysilicon gate electrode 16 have lower potentials in stepwise in the opposite direction to a traveling direction of charges. By making a potential gradient under the second polysilicon gate electrode 16 in stepwise of multiple steps, signal charges can be easily transferred to a region under the next polysilicon gate electrode 15 even at an input of a low-voltage pulse.

Figure 3:
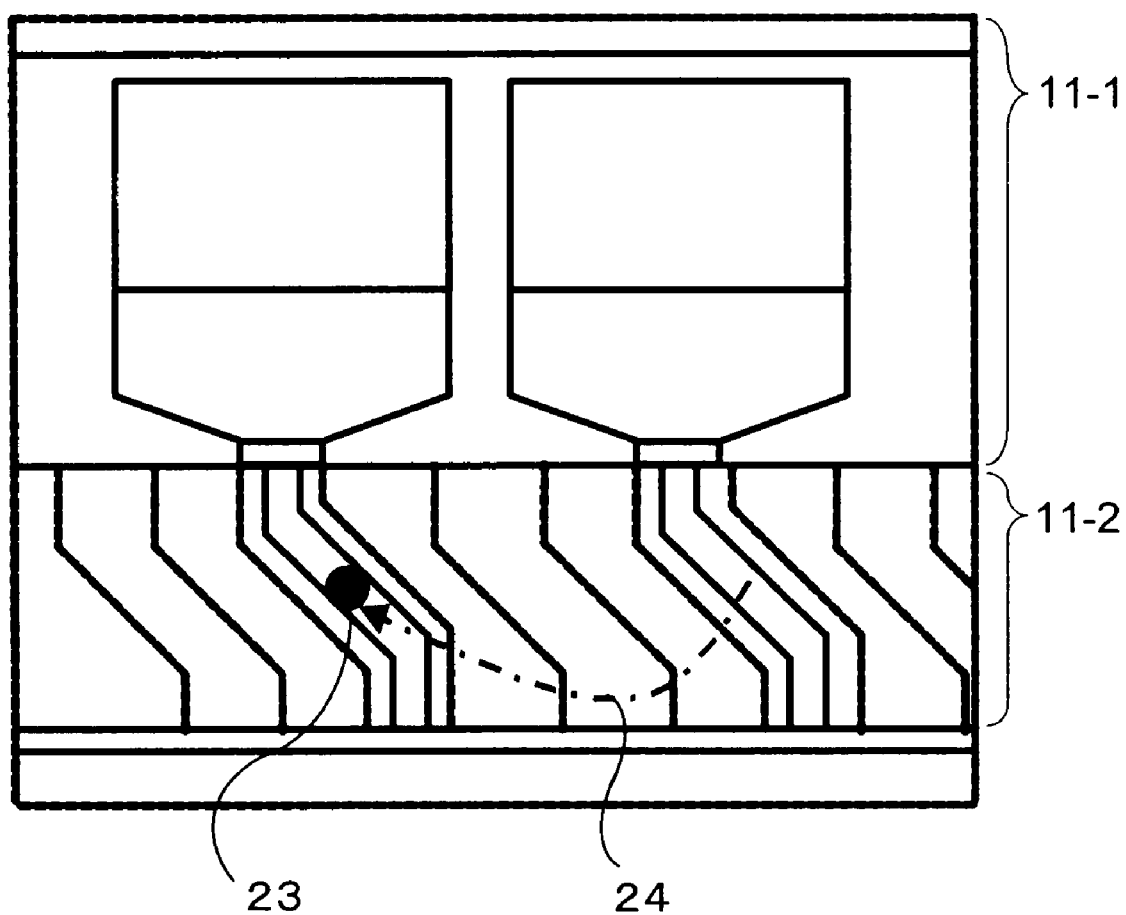
FIG. 3 is a top view illustrating operation of the solid state imaging device according to the present invention in FIG. 1.

FIG. 3 illustrates a signal charge 23 transferred inside the channel region 11-2 and a trajectory 24 of the signal charge to be transferred. The trajectory 24 of the signal charge to be transferred proceeds toward a signal charge transfer direction as a whole, that is, from the right to the left in FIG. 1 while traversing the first polysilicon gate electrode 15-3 and the second polysilicon gate electrode 16-3 disposed obliquely to a signal charge transfer direction in the perpendicular direction to each thereof at the central portion of the channel region 11-2. Accordingly, the trajectory proceeds toward the lower end portion of the channel region 11-2, that is, the channel stop region 20. However, at the end portion of the channel region 11-2, the first polysilicon gate electrode 15-2, the second polysilicon gate electrode 16-2 and the diffusion layers 17-2, 18-2, 19-2 under the second polysilicon gate electrode 16-2 are arranged perpendicularly to a signal charge transfer direction. Accordingly, the signal charge 23 moves perpendicularly to the electrodes or the diffusion layers, and thus the trajectory is corrected to be in a proper transfer direction in which the signal charges 23 are supposed to move. Hence, the trajectory 24 of a signal charge attempting to move to the lower end portion of the channel region 11-2 is corrected upwardly. Therefore the signal charges 23 move from the right to the left inside the channel region 11-2 as a whole without colliding with the channel stop region 20. FIG.

3 illustrates an example of transfer of the signal charge 23 moving to the end portion of the channel region 11-2 while a trajectory is being corrected to be at the central portion of the channel region 11-2 as above described.

Such a trajectory correction can be easily changed by adjusting the length or width of a perpendicular region of the first polysilicon gate electrode 15-2, the second polysilicon gate electrode 16-2 or the diffusion layers 17-2, 18-2, 19-2 under the second polysilicon gate electrode 16-2.

Figure 4:
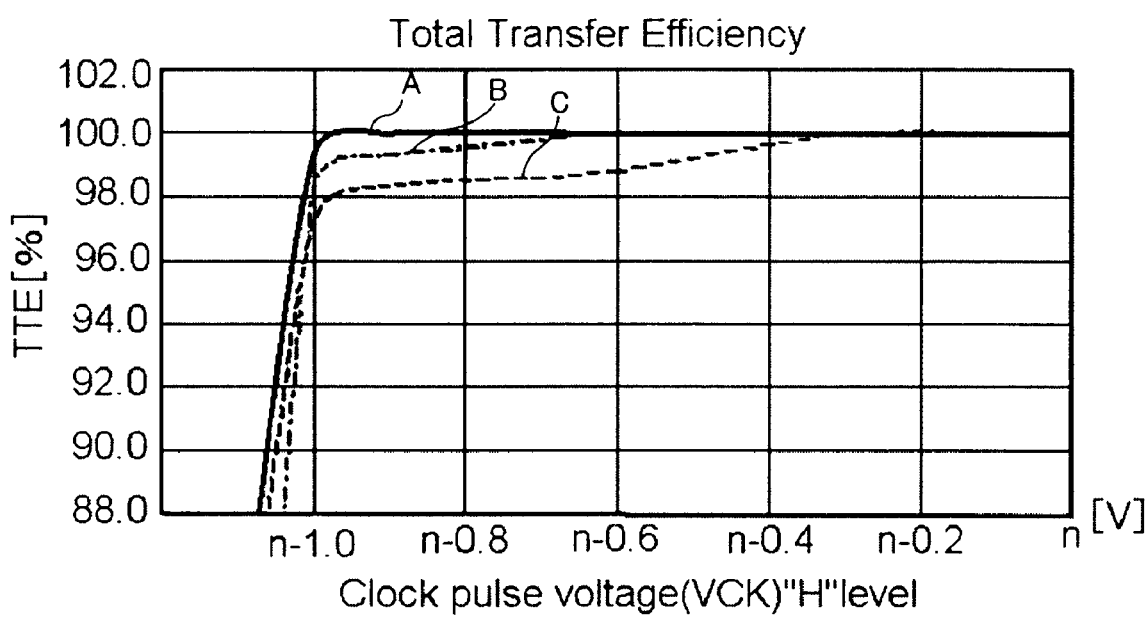
FIG. 4 is a simulation result showing a relationship between transfer voltage level and transfer efficiency of signal charges in a solid state imaging device according to the present embodiment, as compared to a conventional solid state imaging device.

FIG. 4 is a graph illustrating a simulation result of a relationship between the level of voltage applied to an electrode and transfer efficiency of signal charges in transferring signal charges upon applying the voltage using a solid state imaging device according to the present invention and using a solid state imaging device according to a conventional example. This means that FIG.4 illustrates a simulation result showing the relationship of transfer efficiency of signal charge to voltage applied to the electrode using a solid state imaging device according to the present invention and using a solid state imaging device according to a conventional example. The vertical axis in FIG. 4 shows Total Transfer Efficiency and the horizontal axis shows a "High" voltage level of amplitude of a transfer clock pulse. The label of the horizontal axis shows a minimum "High" voltage level of amplitude of a transfer clock pulse assuming the minimum voltage level of the transfer clock pulse as nV and shows voltage levels sequentially decreasing toward coordinate origin at intervals of 0.2 V from the maximum level.

In FIG. 4, a curve A shows a simulation result of a solid state imaging device according to an embodiment of the present invention and a curve C shows a simulation result of a conventional solid state imaging device. Further, a curve B shows, for reference, a simulation result of a conventional solid state imaging device having channel region in which storage electrodes and barrier electrodes are disposed perpendicularly to a signal charge transfer direction over the overall length thereof.

From FIG. 4, it can be seen that signal charge transfer efficiency shown as the curve A has higher resistance to degradation than that of a conventional solid state imaging device shown as the curve B or the curve C, even when a low-voltage pulse is applied.

Furthermore, it is confirmed by a simulation result that the signal charge transfer speed using the solid state imaging device according to the present invention can be increased by substantially 14% than that using a conventional one, although not illustrated.

As seen from the above description, the solid state imaging device according to the present invention can transfer signal charges at higher speed and with higher efficiency even at low driving voltage than a conventional example. Further, the solid state imaging device according to the present invention, operating with low driving voltage, can suppress generation of EMI noise.

What is claimed is:

1. A solid state imaging device comprising:
    a plurality of photoelectric conversion elements arranged on a semiconductor substrate in a one-dimensional or two-dimensional array;
    a plurality of read gate electrodes for reading the signal charges obtained from the photoelectric conversion elements;
    a plurality of transfer gate electrodes for transferring the signal charges read by the read gates to a channel region;
    a plurality of storage electrodes for storing the signal charges transferred through transfer gates in the channel region;
    a plurality of barrier electrodes for transferring the signal charges stored under the storage electrodes to a region under the storage electrodes adjacent in the channel region, and
    a plurality of diffusion layers having different depths, provided under the barrier electrodes, wherein
    both end portions of the plurality of storage electrodes and the plurality of barrier electrodes are arranged perpendicularly to a transfer direction of signal charges in the channel region;
    the central portions of the plurality of storage electrodes and the plurality of barrier electrodes are arranged obliquely to the transfer direction of signal charges;
    the plurality of diffusion layers under the barrier electrodes have different depths sequentially in parallel direction to a transfer direction of signal charges;
    both end portions of the diffusion layers are arranged perpendicularly to a transfer direction of signal charges; and
    central portions of the diffusion layers are arranged obliquely to a transfer direction of signal charges.

2. The solid state imaging device according to claim 1, wherein the semiconductor substrate is a first conductivity type semiconductor substrate and the photoelectric conversion element is a second conductivity type semiconductor layer embedded in the semiconductor substrate.

3. The solid state imaging device according to claim 2, wherein the channel region is a second conductivity type semiconductor layer embedded in the first conductivity type semiconductor substrate.

4. The solid state imaging device according to claim 1, wherein the plurality of storage electrodes and the plurality of barrier electrodes are band-like electrodes formed to traverse the channel region.

5. The solid state imaging device according to claim 1, wherein the plurality of diffusion layers under the barrier electrodes are band-like regions formed, traversing the channel regions.

6. The solid state imaging device according to claim 1, wherein channel stop regions are formed at both end portions of the channel region in width direction thereof.

7. The solid state imaging device according to claim 1, wherein the diffusion layers under the barrier electrodes are second conductivity type high-concentration diffusion layers and sequentially arranged in such a manner that the depths thereof get smaller toward the transfer direction of signal charges.

8. The solid state imaging device according to claim 1, wherein the respective photoelectric conversion elements have an substantially rectangular shape and the respective transfer gate electrodes are formed in trapezoidal shape, one side thereof on the photoelectric conversion element side has a width substantially the same as a width of the photoelectric conversion element and the other side thereof on the opposite side to the photoelectric conversion element has a width smaller than a width of the photoelectric conversion element.

9. The solid state imaging device according to claim 1, wherein a width of each of the plurality of storage electrodes is substantially same as that of the shorter side of the transfer gate electrode.

10. A solid state imaging device comprising:
    a plurality of photoelectric conversion elements arranged on a semiconductor substrate in a one-dimensional or two-dimensional array;
    a plurality of read gate electrodes for reading the signal charges obtained from the photoelectric conversion elements;

a plurality of transfer gate electrodes for transferring the signal charges read by the read gates to a channel region;

a plurality of storage electrodes for storing the signal charges transferred through transfer gates in the channel region; and a plurality of barrier electrodes for transferring the signal charges stored under the storage electrodes to under the storage electrodes adjacent in the channel region, wherein both end portions of the plurality of storage electrodes and the plurality of barrier electrodes are arranged perpendicularly to a transfer direction of signal charges in the channel region; and the central portions of the plurality of storage electrodes and the plurality of barrier electrodes are arranged obliquely to the transfer direction of signal charges.

11. The solid state imaging device according to claim 10, wherein the semiconductor substrate is a first conductivity type semiconductor substrate and the photoelectric conversion element is a second conductivity type semiconductor layer embedded in the semiconductor substrate.

12. The solid state imaging device according to claim 11, wherein the channel region is a second conductivity type semiconductor layer embedded in the first conductivity type semiconductor substrate.

13. The solid state imaging device according to claim 10, wherein the plurality of storage electrodes and the plurality of barrier electrodes are band-like electrodes formed to traverse the channel region.

14. The solid state imaging device according to claim 10, wherein channel stop regions are formed at both end portions of the respective channel region parallel to a longitudinal direction.

* * * * *